(12) United States Patent
Tomioka

(10) Patent No.: US 11,809,208 B2
(45) Date of Patent: Nov. 7, 2023

(54) SHUNT REGULATOR

(71) Applicant: ABLIC Inc., Tokyo (JP)

(72) Inventor: Tsutomu Tomioka, Tokyo (JP)

(73) Assignee: ABLIC Inc., Nagano (JP)

( * ) Notice: Subject to any disclaimer, the term of this patent is extended or adjusted under 35 U.S.C. 154(b) by 0 days.

(21) Appl. No.: 17/584,314

(22) Filed: Jan. 25, 2022

(65) Prior Publication Data

US 2022/0317714 A1 Oct. 6, 2022

(30) Foreign Application Priority Data

Apr. 6, 2021 (JP) ................. 2021-064500

(51) Int. Cl.
*G05F 1/613* (2006.01)
*G11C 7/10* (2006.01)
(52) U.S. Cl.
CPC ............ *G05F 1/613* (2013.01); *G11C 7/1069* (2013.01)
(58) Field of Classification Search
CPC .......... G05F 1/613; G05F 1/614; G05F 1/618; G11C 7/1069
See application file for complete search history.

(56) References Cited

U.S. PATENT DOCUMENTS

| 8,085,006 B2 | 12/2011 | Burger-Riccio et al. |
| 2018/0217623 A1* | 8/2018 | Bhattad ................ G05F 1/575 |
| 2022/0308614 A1* | 9/2022 | Tomioka ............... G05F 1/565 |

* cited by examiner

*Primary Examiner* — Nguyen Tran
(74) *Attorney, Agent, or Firm* — JCIPRNET

(57) ABSTRACT

A shunt regulator includes: a capacitor, connected between an output terminal and a ground terminal; a voltage divider circuit and an output transistor, connected between the output terminal and the ground terminal; an error amplifier, controlling the output transistor based on a voltage at an output terminal of the voltage divider circuit and a reference voltage; a non-volatile memory; a memory control circuit, outputting a data read signal to the non-volatile memory; and a voltage detection circuit, detecting that a voltage at the output terminal has reached a predetermined voltage which permits a data reading operation of the non-volatile memory, and outputting a detection signal to the memory control circuit. An operating current of the non-volatile memory is supplied from the capacitor.

8 Claims, 3 Drawing Sheets

SHUNT REGULATOR

CROSS-REFERENCE TO RELATED APPLICATIONS

This application claims the priority benefit of Japan Application No. 2021-064500, filed on Apr. 6, 2021. The entirety of the above-mentioned patent application is hereby incorporated by reference herein and made a part of this specification.

BACKGROUND

Technical Field

The present invention relates to a shunt regulator.

Related Art

FIG. 5 is a circuit diagram illustrating a conventional shunt regulator.

The shunt regulator of FIG. 5 includes a reference voltage circuit 101, an error amplifier 102, an N-channel metal-oxide semiconductor (NMOS) transistor 103, and voltage divider resistors R1 and R2.

When the shunt regulator receives a power supply voltage Vin, by an output voltage Vout generated by a current flowing through an external resistor 110, a load 111 is driven. If the current flowing through the external resistor 110 having a resistance value R is Ir, the current flowing through the load 111 is Io, and the current flowing through the shunt regulator IC is Ic, then the output voltage Vout is expressed by the following equation.

$$Vout = Vin - Ir/R = Vin - (Io + Ic)/R$$

In the shunt regulator, the NMOS transistor 103 adjusts the current Ic and obtains the desired output voltage Vout. That is, in the shunt regulator, since Ir=Io+Ic, it is necessary to take into account the current Ic flowing through the shunt regulator IC to determine the current Ir.

However, in the case where the shunt regulator includes a circuit (for example, a non-volatile memory) through which a large current flows during operation, because it is also necessary to take into account the operating current of this circuit to determine the current Ir, when this circuit is not operating, a corresponding current needs to flow through the NMOS transistor 103. Accordingly, the conventional shunt regulator has a problem that a large current wastefully flows during normal operation when the circuit is not operating.

SUMMARY

The present invention provides a shunt regulator in which, even if the shunt regulator includes a circuit through which a large current flows during operation, current consumption during normal operation can be reduced.

In an aspect of the present invention, a shunt regulator includes: an output terminal, connected to a power supply terminal via an external resistor; a capacitor, connected between the output terminal and a ground terminal; a voltage divider circuit, connected in series between the output terminal and the ground terminal; an output transistor, connected between the output terminal and the ground terminal; a first reference voltage circuit, outputting a first reference voltage; an error amplifier, controlling the output transistor based on a voltage at an output terminal of the voltage divider circuit and the first reference voltage; a non-volatile memory; a memory control circuit, outputting a data read signal to the non-volatile memory; and a voltage detection circuit, detecting that a voltage at the output terminal has reached a predetermined voltage which permits a data reading operation of the non-volatile memory, and outputting a detection signal to the memory control circuit. An operating current of the non-volatile memory is supplied from the capacitor.

According to the shunt regulator of the present invention, since the capacitor is provided in the output terminal and the voltage detection circuit which detects the output voltage is provided, even if there is provided a circuit through which a large current flows during operation, it is possible to reduce current consumption during normal operation.

DESCRIPTION OF THE EMBODIMENTS

Hereinafter, a shunt regulator of the present invention will be described with reference to the drawings.

Figure 1:
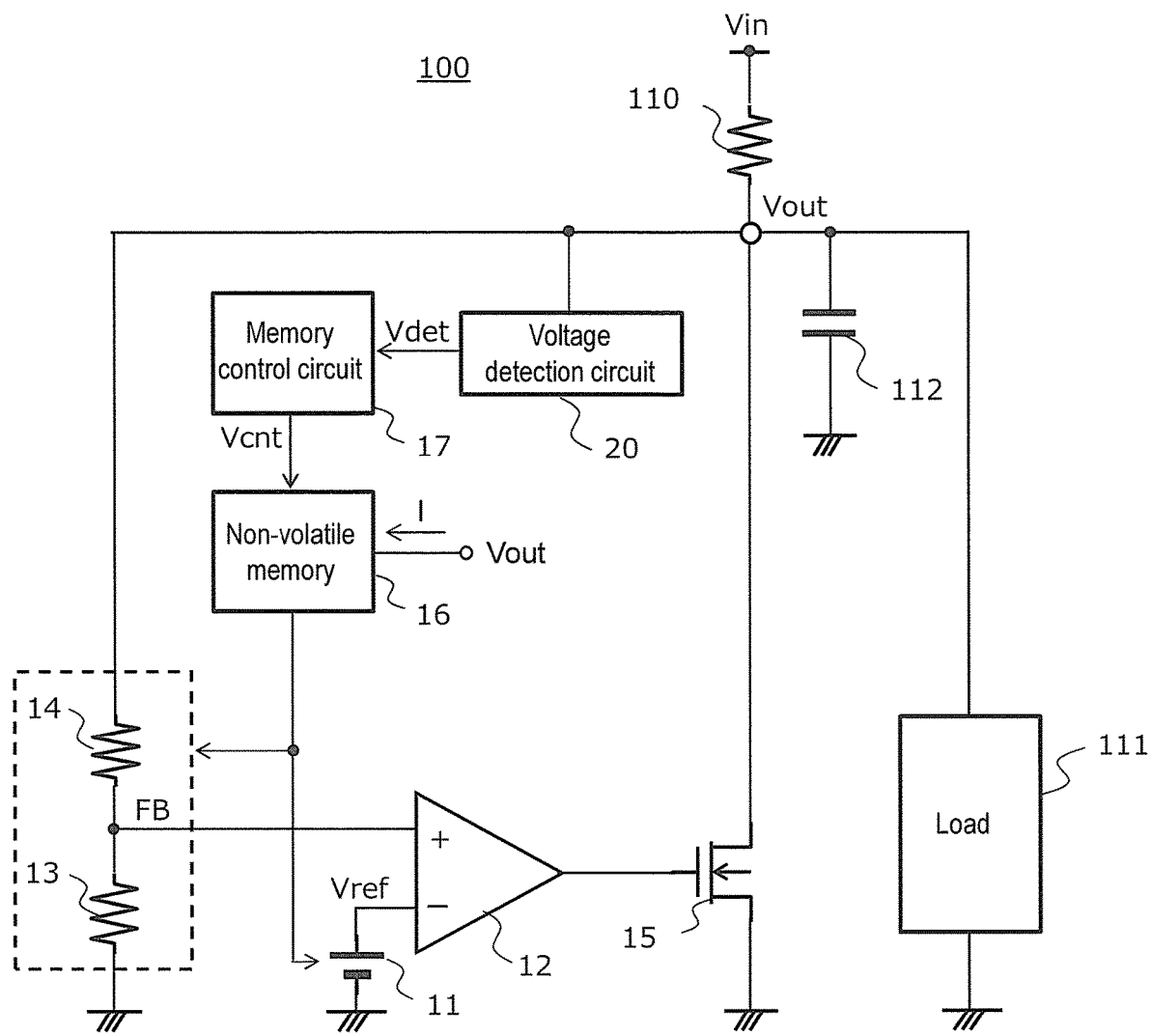
FIG. 1 is a block diagram illustrating a shunt regulator of the present embodiment.

FIG. 1 is a block diagram illustrating a shunt regulator 100 of the present embodiment.

The shunt regulator 100 includes, for example, a non-volatile memory through which a large current flows during data reading. A current flowing through an external resistor is set to an amount that does not take into account the operating current of the non-volatile memory.

The shunt regulator 100 in FIG. 1 includes a reference voltage circuit 11, an error amplifier 12, resistors 13 and 14 which constitute a voltage divider circuit, an NMOS transistor 15 which is an output transistor, a non-volatile memory 16, a memory control circuit 17, a voltage detection circuit 20, an external resistor 110, and a capacitor 112.

The resistors 13 and 14 are connected in series between an output terminal and a ground terminal. An output terminal of the reference voltage circuit 11 is connected to an inverting input terminal (indicated by "−" in the drawings) of the error amplifier 12, an output terminal FB (connection point of the resistors 13 and 14) of the voltage divider circuit is connected to a non-inverting input terminal (indicated by "+" in the drawings) of the error amplifier 12, and an output terminal of the error amplifier 12 is connected to a gate of the NMOS transistor 15. An input terminal of the voltage detection circuit 20 is connected to an output terminal of the shunt regulator 100, and an output terminal of the voltage detection circuit 20 is connected to an input terminal of the memory control circuit 17. An output terminal of the memory control circuit 17 is connected to an input terminal of the non-volatile memory 16. An output terminal of the non-volatile memory 16 is connected to, for example, a control terminal of the voltage divider circuit or a control terminal of the reference voltage circuit 11. The capacitor 112 is connected between the output terminal and a ground terminal of the shunt regulator 100. The external resistor 110 is connected between a power supply terminal which receives a power supply voltage Vin and the output terminal of the shunt regulator 100. A load 111 is connected between the output terminal and the ground terminal of the shunt regulator 100.

The non-volatile memory 16 stores circuit parameter data of the shunt regulator 100, for example, data for adjusting the reference voltage circuit 11 or the voltage divider circuit. Since the non-volatile memory 16 has a voltage range in which data reading is enabled, the data read at a minimum read voltage or below are not guaranteed. The memory control memory 17 outputs a control signal Vcnt for reading the data of the non-volatile memory 16 in response to a detection signal Vdet of the voltage detection circuit 20. The voltage detection circuit 20 detects that an output voltage Vout of the shunt regulator 100 has reached a predetermined voltage which permits an operation of the non-volatile memory 16, and outputs the detection signal Vdet.

Figure 2:
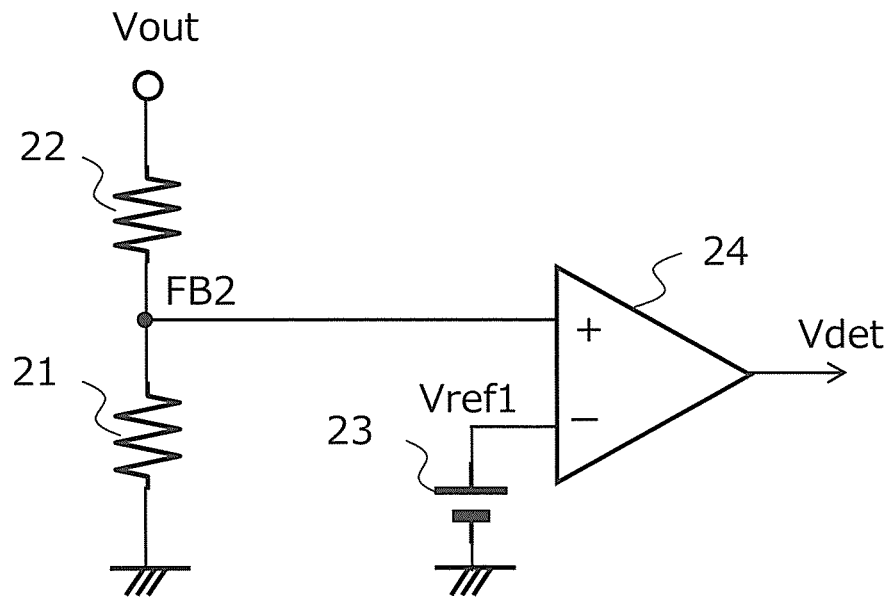
FIG. 2 is a circuit diagram illustrating an example of a voltage detection circuit of the present embodiment.

FIG. 2 is a circuit diagram illustrating an example of the voltage detection circuit 20 of the present embodiment.

The voltage detection circuit 20 includes resistors 21 and 22 which constitute a voltage divider circuit, a reference voltage circuit 23, and a comparator 24.

The resistors 21 and 22 are connected between an output terminal and a ground terminal. An output terminal FB2 (connection point of the resistors 21 and 22) of the voltage divider circuit is connected to the non-inverting input terminal ("+") of the comparator 24, an output terminal of the reference voltage circuit 23 is connected to the inverting input terminal ("−") of the comparator 24, and the detection signal Vdet is output from an output terminal of the comparator 24.

The shunt regulator 100 configured as described above operates as follows.

When the shunt regulator 100 receives the power supply voltage Vin, a current flows through the external resistor 110, and the output voltage Vout is output to the output terminal. The output voltage Vout gradually increases as electric charge is charged to the capacitor 112 connected to the output terminal. Accordingly, a voltage at the output terminal FB2 of the voltage divider circuit of the voltage detection circuit 20 also gradually increases. In the comparator 24, when the voltage at the output terminal FB2, which is received by the non-inverting input terminal ("+"), is equal to or higher than a reference voltage Vref1 of the reference voltage circuit 23, the comparator 24 outputs the detection signal Vdet at a Hi level.

In the memory control circuit 17, when the input terminal receives the detection signal Vdet at a Hi level from the output terminal of the voltage detection circuit 20, the memory control circuit 17 latches the detection signal Vdet, and outputs the control signal Vcnt at a Hi level from the output terminal to the input terminal of the non-volatile memory 16. When the non-volatile memory 16 receives the control signal Vcnt at a Hi level, data reading is started.

The data reading operation of the non-volatile memory 16 requires a large current I which is supplied from the electric charge accumulated in the capacitor 112. Hence, a voltage of the capacitor 112, that is, the output voltage Vout at the output terminal, gradually decreases due to the data reading operation of the non-volatile memory 16. Here, the reference voltage Vref1 is set to a voltage at which the output voltage Vout does not fall below the minimum read voltage until the data reading operation of the non-volatile memory 16 is ended. When the data reading operation of the non-volatile memory 16 is ended, the output voltage Vout at the output terminal gradually increases together with the voltage of the capacitor 112, and the non-volatile memory 16 shifts to a normal operating state. The memory control signal 17 is configured not to output the control signal Vcnt even if the latch of the detection signal Vdet of the voltage detection circuit 20 is released and the detection signal Vdet is received again.

As described above, in the shunt regulator 100 of the present embodiment, since the voltage detection circuit 20 is configured to detect that the output voltage Vout at the output terminal has reached the voltage required for the data reading operation of the non-volatile memory 16, and the capacitor 112 is configured to supply the current required for the data reading operation, current consumption during normal operation can be reduced.

Figure 3:
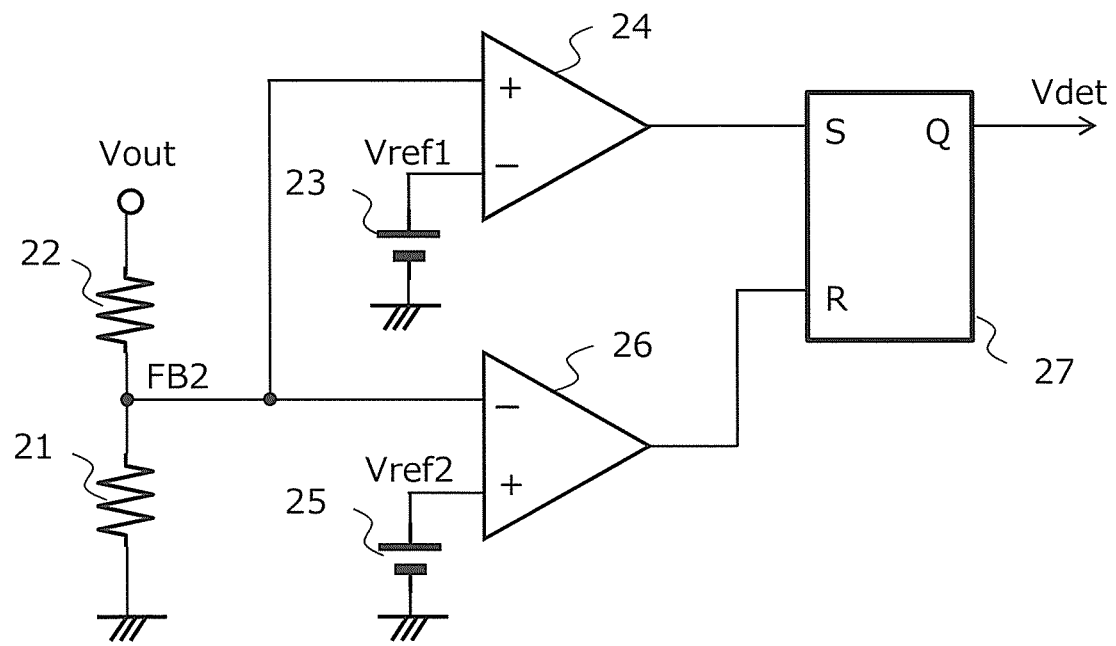
FIG. 3 is a circuit diagram illustrating another example of a voltage detection circuit of the present embodiment.

FIG. 3 is a circuit diagram illustrating another example of the voltage detection circuit 20 of the present embodiment.

The voltage detection circuit 20 includes the resistors 21 and 22 which constitute the voltage divider circuit, the reference voltage circuit 23 and the comparator 24 which constitute an upper limit voltage detection circuit, a reference voltage circuit 25 and a comparator 26 which constitute a lower limit voltage detection circuit, and a set-reset (SR) latch circuit 27.

The resistors 21 and 22 are connected between the output terminal and the ground terminal. The output terminal FB2 (connection point of the resistors 21 and 22) of the voltage divider circuit is connected to the non-inverting input terminal ("+") of the comparator 24, the output terminal of the reference voltage circuit 23 is connected to the inverting input terminal ("−") of the comparator 24, and an upper limit detection signal is output from the output terminal of the comparator 24. The output terminal FB2 (connection point of the resistors 21 and 22) of the voltage divider circuit is connected to the inverting input terminal ("−") of the comparator 26, an output terminal of the reference voltage circuit 25 is connected to the non-inverting input terminal ("+") of the comparator 26, and a lower limit detection signal is output from an output terminal of the comparator 26. The output terminal of the comparator 24 is connected to a set terminal S of the SR latch circuit 27, the output terminal of the comparator 26 is connected to a reset terminal R of the SR latch circuit 27, and the detection signal Vdet is output from an output terminal Q of the SR latch circuit 27.

The shunt regulator 100 configured as described above operates as follows.

When the shunt regulator 100 receives the power supply voltage Vin, a current flows through the external resistor 110, and the output voltage Vout is output to the output terminal. The output voltage Vout gradually increases as electric charge is charged to the capacitor 112 connected to the output terminal. Accordingly, the voltage at the output terminal FB2 of the voltage divider circuit of the voltage detection circuit 20 also gradually increases. In the comparator 24, when the voltage at the output terminal FB2, which is received by the non-inverting input terminal ("+"), is equal to or higher than the reference voltage Vref1 of the reference voltage circuit 23, the comparator 24 outputs the upper limit detection signal at a Hi level.

In the SR latch circuit 27, when the set terminal S receives the upper limit detection signal at a Hi level, the SR latch circuit 27 outputs the detection signal Vdet at a Hi level from the output terminal Q. In the memory control circuit 17, when the input terminal receives the detection signal Vdet at a Hi level from the output terminal of the voltage detection circuit 20, the memory control circuit 17 outputs the control signal Vcnt at a Hi level from the output terminal to the input terminal of the non-volatile memory 16. When the non-volatile memory 16 receives the control signal Vcnt at a Hi level, data reading is started.

The voltage detection circuit 20 of FIG. 3 includes the comparator 26 and the reference voltage circuit 25. The reference voltage circuit 25 is set to a voltage at which the output voltage Vout at the output terminal does not fall below the minimum read voltage of the non-volatile memory 16. Accordingly, when the voltage at the output terminal FB2 of the voltage divider circuit falls below a reference voltage Vref2, the comparator 26 outputs the lower limit detection signal at a Hi level from the output terminal.

In the SR latch circuit 27, when the reset terminal R receives the lower limit detection signal at a Hi level, the SR latch circuit 27 outputs the detection signal Vdet at a Lo level from the output terminal Q. In the memory control circuit 17, when the input terminal receives the detection signal Vdet at a Lo level from the output terminal of the voltage detection circuit 20, the memory control circuit 17 stops outputting the control signal Vcnt at a Hi level to the non-volatile memory 16. Accordingly, the non-volatile memory 16 stops data reading. Here, since the voltage detection circuit 20 of FIG. 3 outputs the detection signal Vdet at a Lo level based on the lower limit detection signal, the memory control signal 17 does not necessarily have a latching function.

When data reading is stopped, the output voltage Vout at the output terminal increases. In the comparator 24, when the voltage at the output terminal FB2, which is received by the non-inverting input terminal ("+"), is equal to or higher than the reference voltage Vref1 of the reference voltage circuit 23, the comparator 24 outputs the upper limit detection signal at a Hi level. Accordingly, the non-volatile memory 16 resumes data reading.

In the voltage detection circuit 20 of FIG. 3, by repeating the above operation, the reading operation can be performed in the voltage range in which the output voltage Vout at the output terminal does not fall below the minimum read voltage of the non-volatile memory 16. Accordingly, it is possible for the shunt regulator 100 which includes the voltage detection circuit 20 of FIG. 3 to deal with an unexpected condition such as a fluctuation in the output voltage Vout at the output terminal during the reading operation of the non-volatile memory 16.

Figure 4:
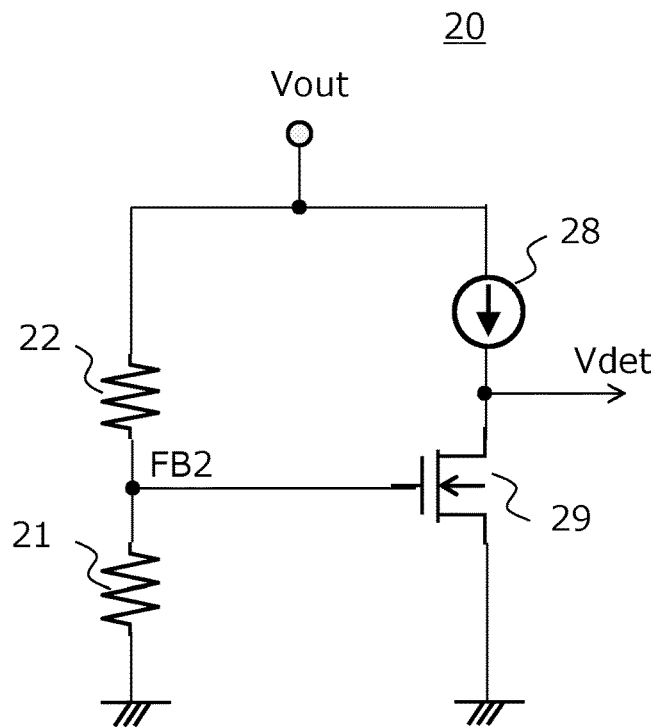
FIG. 4 is a circuit diagram illustrating another example of a voltage detection circuit of the present embodiment.
Figure 5:
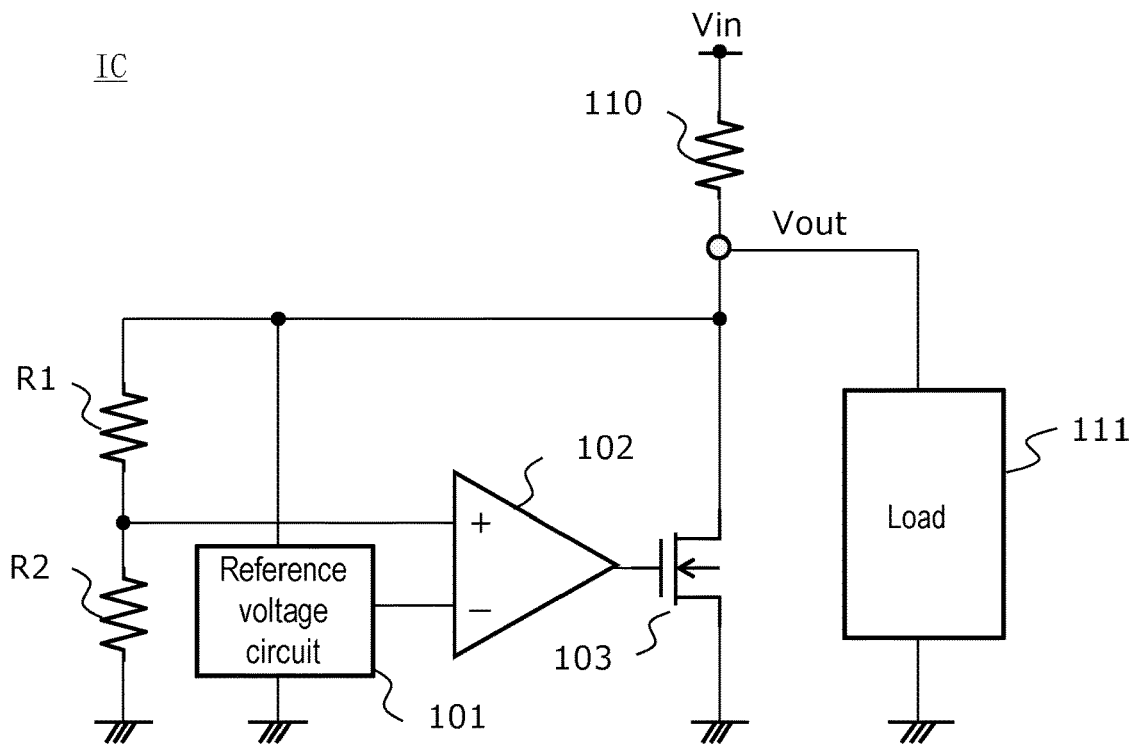
FIG. 5 is a block diagram illustrating a conventional shunt regulator.

Although the embodiments of the present invention have been described above, the present invention is not limited to the above embodiments, and various changes can be made without departing from the spirit of the present invention. A non-volatile memory has been described as an example of a circuit through which a large current flows during operation. However, the present invention is not limited thereto if the circuit does not always operate. In addition, for example, the voltage detection circuit 20 illustrated in FIG. 2 may be composed of a current comparison circuit including a constant current circuit 28 and an NMOS transistor 29 as illustrated in FIG. 4. This circuit can also be applied to the voltage detection circuit 20 illustrated in FIG. 3. In addition, for example, in the voltage detection circuit 20 illustrated in FIG. 3, since it is sufficient if the upper limit detection signal and the lower limit detection signal can be output to the SR latch circuit, two output terminals may be provided in the voltage divider circuit and connected to the same reference voltage circuit. If the function is satisfied, the present invention is not limited to the SR latch circuit. In addition, for example, the upper limit detection signal and the lower limit detection signal of the voltage detection circuit 20 have been described as detection signals at a Hi level. However, the logic can be freely designed.

What is claimed is:

1. A shunt regulator, comprising:
   an output terminal, connected to a power supply terminal via an external resistor;
   a capacitor, connected between the output terminal and a ground terminal;
   a voltage divider circuit, connected in series between the output terminal and the ground terminal;
   an output transistor, connected between the output terminal and the ground terminal;
   a first reference voltage circuit, outputting a first reference voltage;
   an error amplifier, controlling the output transistor based on a voltage at an output terminal of the voltage divider circuit and the first reference voltage;
   a non-volatile memory;
   a memory control circuit, outputting a data read signal to the non-volatile memory; and
   a voltage detection circuit, detecting that a voltage at the output terminal has reached a predetermined voltage which permits a data reading operation of the non-volatile memory, and outputting a detection signal to the memory control circuit, wherein
   an operating current of the non-volatile memory is supplied from the capacitor.

2. The shunt regulator according to claim 1, wherein the voltage detection circuit comprises:
   a second voltage divider circuit, connected in series between the output terminal and the ground terminal;
   a second reference voltage circuit, outputting a second reference voltage; and
   a first comparator, outputting the detection signal based on a voltage at an output terminal of the second voltage divider circuit and the second reference voltage.

3. The shunt regulator according to claim 1, wherein the voltage detection circuit comprises:
   a second voltage divider circuit, connected in series between the output terminal and the ground terminal;
   a constant current circuit, having one terminal connected to the output terminal; and
   an NMOS transistor, in which an output terminal of the second voltage divider circuit is connected to a gate of the NMOS transistor, the other terminal of the constant current circuit is connected to a drain of the NMOS transistor, and the ground terminal is connected to a source of the NMOS transistor.

4. The shunt regulator according to claim 1, wherein the voltage detection circuit comprises:
   a second voltage divider circuit, connected in series between the output terminal and the ground terminal;
   a second reference voltage circuit, outputting a second reference voltage;
   a first comparator, outputting an upper limit detection signal based on a voltage at an output terminal of the second voltage divider circuit and the second reference voltage;
   a third reference voltage circuit, outputting a third reference voltage; and
   a second comparator, outputting a lower limit detection signal based on the voltage at the output terminal of the second voltage divider circuit and the third reference voltage, wherein
   the detection signal is output based on the upper limit detection signal and the lower limit detection signal.

5. The shunt regulator according to claim 1, wherein the voltage detection circuit comprises:
   a second voltage divider circuit, connected in series between the output terminal and the ground terminal;
   a second reference voltage circuit, outputting a second reference voltage;
   a first comparator, outputting an upper limit detection signal based on a voltage at a first output terminal of the second voltage divider circuit and the second reference voltage; and
   a second comparator, outputting a lower limit detection signal based on a voltage at a second output terminal of the second voltage divider circuit and the second reference voltage, wherein
the detection signal is output based on the upper limit detection signal and the lower limit detection signal.

6. The shunt regulator according to claim 4, wherein the voltage detection circuit comprises:
   a latch circuit, having a set terminal which receives the upper limit detection signal and a reset terminal which receives the lower limit detection signal, and outputting the detection signal from an output terminal.

7. A shunt regulator, comprising:
an output terminal, connected to a power supply terminal via an external resistor;
a capacitor, connected between the output terminal and a ground terminal;
a voltage divider circuit, connected in series between the output terminal and the ground terminal;
an output transistor, connected between the output terminal and the ground terminal;
a first reference voltage circuit, outputting a first reference voltage;
an error amplifier, controlling the output transistor based on a voltage at an output terminal of the voltage divider circuit and the first reference voltage;
a circuit through which a large current flows during operation; and
a voltage detection circuit, detecting that a voltage at the output terminal has reached a predetermined voltage which permits an operation of the circuit through which a large current flows during operation and outputting an operation permission signal to the circuit, wherein
an operating current of the circuit through which a large current flows during operation is supplied from the capacitor.

8. The shunt regulator according to claim 7, wherein the voltage detection circuit comprises:
   a latch circuit, having a set terminal which receives the upper limit detection signal and a reset terminal which receives the lower limit detection signal, and outputting the detection signal from an output terminal.

* * * * *